Figure 1:
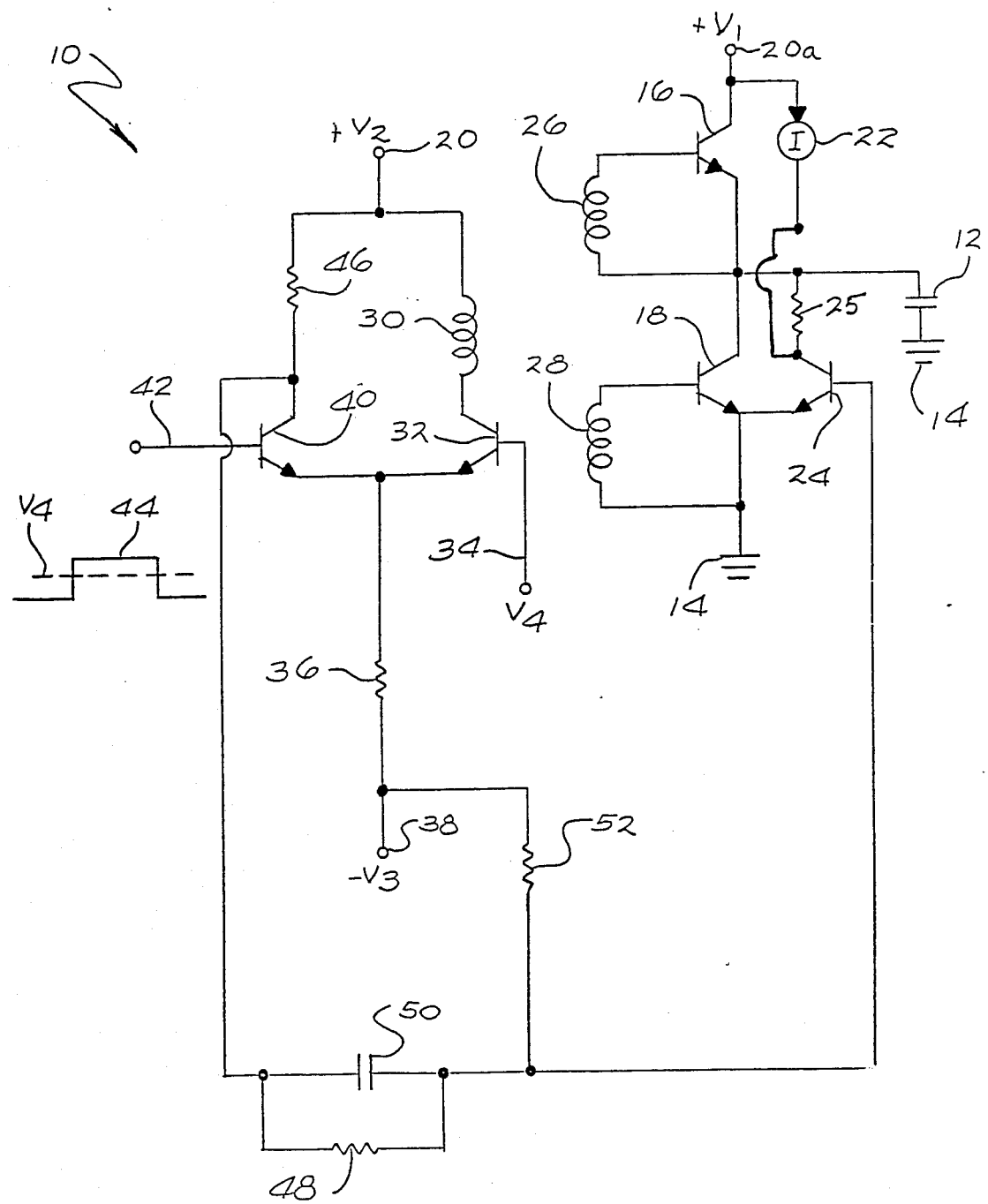

United States Patent [19]

Katzenstein

[11] Patent Number: 4,733,153
[45] Date of Patent: Mar. 22, 1988

[54] SWITCHING SYSTEM FOR CAPACITOR CHARGING/DISCHARGING

[75] Inventor: Henry S. Katzenstein, Pacific Palisades, Calif.

[73] Assignee: Brooktree Corporation, San Diego, Calif.

[21] Appl. No.: 69,317

[22] Filed: Jul. 2, 1987

[51] Int. Cl.⁴ .......................... H03K 7/06; H02M 7/00; H03G 3/00
[52] U.S. Cl. ........................................ 320/1; 307/108; 307/109
[58] Field of Search .................... 320/1; 323/282, 903; 307/106, 270, 108, 109; 363/86, 49

[56] References Cited

U.S. PATENT DOCUMENTS

| | | | |
|---|---|---|---|
| 4,455,526 | 6/1984 | Miller | 323/282 |
| 4,546,268 | 10/1985 | Caldwell et al. | 307/106 X |
| 4,553,082 | 11/1985 | Nesler | 323/282 X |
| 4,555,655 | 11/1985 | Tanaka | 320/1 |
| 4,577,166 | 3/1986 | Milberger et al. | 307/106 X |
| 4,586,118 | 4/1986 | Mihalka | 363/49 X |
| 4,665,476 | 5/1987 | Masuda | 363/128 X |

Primary Examiner—R. J. Hickey
Attorney, Agent, or Firm—Ellsworth R. Roston; Charles H. Schwartz

[57] ABSTRACT

First and second switches such as transistors are connected to a charge storage member such as a capacitance. The capacitance is charged through the first transistor from a positive supply when the transistor becomes conductive. The capacitances is discharged through the second transistor to a reference potential such as ground when the second transistor becomes conductive. The conductivities of the first and second transistors are controlled by pulses from a pulse source such as a transformer. The transformer primary produces a pulse of one polarity upon the occurrence of the leading edge of an input signal and a pulse of an opposite polarity upon the occurrence of the trailing edge of the input signal. Two secondary windings are respectively connected in opposite polarities to the bases of the first and second transistors to provide for the conductivity of only one of the transistors at any one time. The transformers saturate the conductive transistor to prolong on a limited basis the time during which the transistor remains conductive. The other one of the transistors is made instantaneously non-conductive by providing for an instantaneous discharge of the stored base charge between the base and emitter of the transistor. A constant current source is electrically in parallel with the first transistor to sustain the capacitance charge at a high level after the limited period of time in which the first transistor remains conducitive. A low frequency transistor is connected in parallel with the second transistor to sustain the discharge of the capacitance after the limited period of time in which the second transistor remains conductive.

12 Claims, 2 Drawing Figures

SWITCHING SYSTEM FOR CAPACITOR CHARGING/DISCHARGING

This invention relates to a high speed switching system. More particularly, the invention relates to systems for instantaneously charging or discharging charge storage means such as a capacitance. The invention is also adapted to provide high speed switching systems which are adapted to provide high voltage outputs in accordance with the operation of individual switches in the system.

Switching systems have been in use for many years to control the operation of output members. For example, switches may be used to control the introduction of energy to a wide variety of members such as waveguides, heaters and computers. As technology has advanced, the variety of uses for switches has progressively increased. Furthermore, the specifications for defining the operation of the switches have become progressively tightened.

Uses have been developed for providing stitching systems in which the systems have to operate instantaneously in response to an input signal to introduce large magnitudes of voltage to an output member. For example, the output member may be an optical waveguide or an electro-optically active crystal which operates only at selected times indicated by the input signal to deliver optical energy through an optical circuit. The term "instantaneously" is intended to mean that the switching system has to respond in a nanosecond or less to close a switch which will provide for the delivery of a stored charge to the output member.

As will be appreciated, it is not easy to operate a switch in a nanosecond or less. The problem is considerably magnified when a large amount of a stored charge has to be delivered through the switch when the switch becomes closed. Since a large amount of charge has to be delivered in a short time, a high current flows into and out of the capacitance upon the successive closures of the switch. The requirement to charge and discharge the capacitance slows the time for delivering the charge in the capacitance to the output member when the switch is closed.

Considerable efforts have been made, and significant amounts of money have been expended in such efforts, to provide a switching system which will meet the objectives specified in the previous paragraph. Such efforts have not been entirely successful. It is still difficult, if not impossible, to deliver in a nanosecond or less the charge stored in a capacitance. This is particularly true when the magnitude of the charge stored in the capacitance is large.

This invention provides a switching system which meets the objectives discussed in the previous paragraphs. The system of this invention is able to switch an external charge storage means such as a capacitance between two particular voltage levels in times comparable with the reciprocal of the cut-off frequency of switches such as transistors included in the switching system. The reciprocal of this cut-off frequency may be in the order of one (1) nanosecond or less. The two particular voltage levels may be limited only by the breakdown voltages of the switches. When the switches constitute transistors, this breakdown voltage may be between the collector and the base of the transistors. The system meets the above objectives even while dissipating only a minimal amount of energy.

In one embodiment of the invention, first and second switches such as transistors are connected to a charge storage member such as a capacitance. The capacitance may be external to the embodiment of this invention. The capacitance is charged through the first transistor from a positive supply when the transistor becomes conductive. The capacitance is discharged through the second transistor to a reference potential such as ground when the second transistor becomes conductive.

The conductivities of the first and second transistors are controlled by pulses from a pulse source such as a transformer. The transformer primary produces a pulse of one polarity upon the occurrence of the leading edge of an input signal and a pulse of an opposite polarity upon the occurrence of the trailing edge of the input signal. Two secondary windings are respectively connected in opposite polarities to the bases of the first and second transistors to provide for the conductivity of only one of the transistors at any one time.

The transformers saturate the conductive transistor to prolong on a limited basis the time during which the transistor remains conductive. The other one of the transistors is made instantaneously non-conductive by providing for an instantaneous discharge of the stored base charge between the base and emitter of the transistor.

A constant current source is electrically in parallel with the first transistor to sustain the capacitance charge at a high level after the limited period of time in which the first transistor remains conductive. A low frequency transistor is connected in parallel with the second transistor to sustain the discharge of the capacitance after the limited period of time in which the second transistor remains conductive.

In the drawings:

FIG. 1 is a circuit diagram of the invention: and

Figure 2:
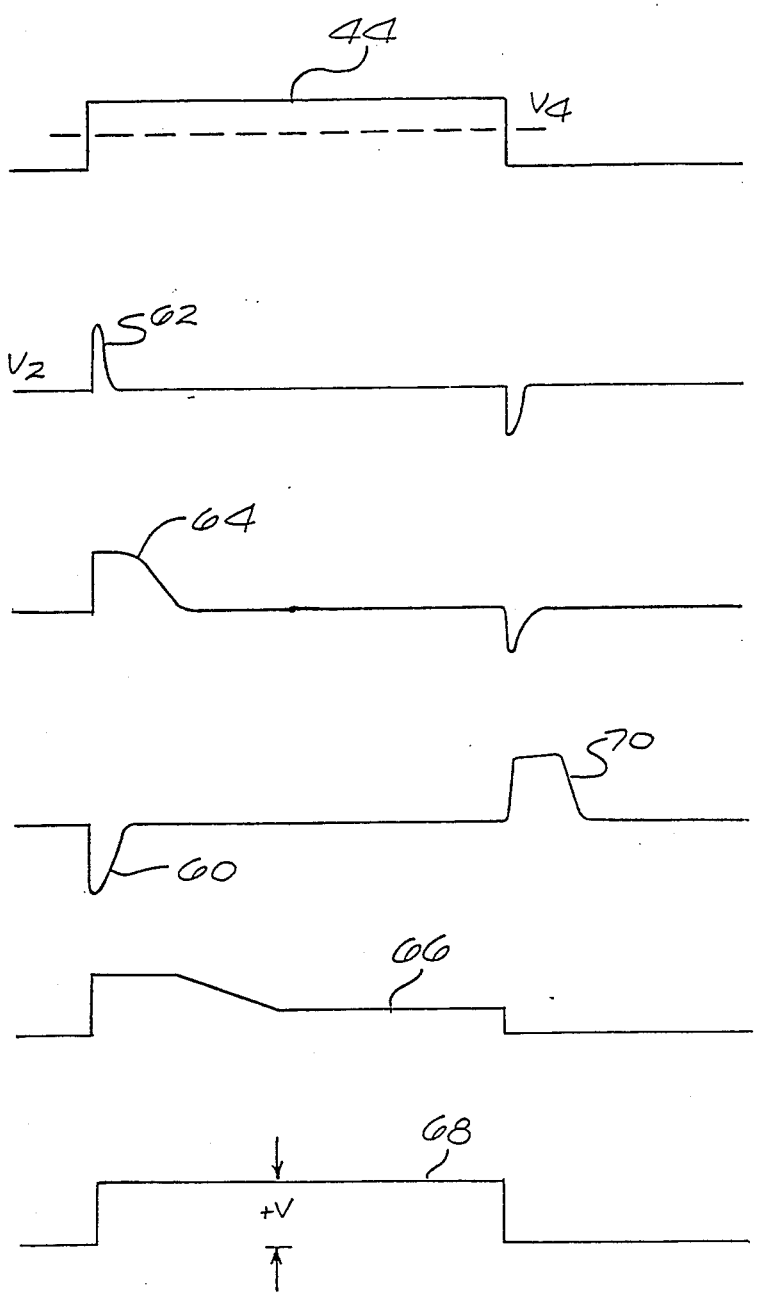

FIG. 2 schematically illustrates voltage waveforms at strategic terminals in the circuit diagram shown in FIG. 1.

In one embodiment of the invention, circuitry generally shown at 10 is illustrated in FIG. 1 for controlling the charge and discharge of a charge storage member such as a capacitance 12. One terminal of the capacitance 12 is common with a reference potential such as a ground 14 and the other terminal of the capacitance 12 has a common connection with a terminal of a switch, such as the emitter of an npn transistor 16, and with a terminal of another switch, such as the collector of an npn transistor 18.

The collector of the transistor 16 receives a positive potential from a source 20a which may be variable. The emitter of the transistor 18 is common with the reference potential such as ground. A constant current source 22 is connected between the collector and the emitter of the transistor 16. The collector and emitter of an npn transistor 24 are respectively common with the collector and the emitter of the transistor 18. A resistance 25 may be connected between the collector of the transistor 24 and the emitter of the transistor 16. As will be appreciated, the transistor 24 is only one embodiment of a switch which may be used.

Pulsing means such as a winding 26 is connected between the base and the emitter of the transister 16. Similarly, connections are made between the end terminals of pulsing means such as a winding 28 and the base and the emitter of the transister 18. The winding 26 preferably has an opposite polarity to the winding 28 so that only one of the transistors 16 and 18 will be triggered to a state of conductivity at any one time by pulses simultaneously produced in the windings 26 and 28. The windings 26 and 28 and a winding 30 may constitute three (3) single turn windings of small diameter wire on a small ferrite bead. The windings 26 and 28 constitute secondary windings which are magnetically coupled to the primary winding 30.

One terminal of the primary winding 30 is connected to the voltage source 20 and the other terminal of the winding 30 is connected to a switch such as to the collector of an npn transistor 32. The base of the transistor 32 receives on a line 34 a potential biasing the transistor to a state of conductivity. The emitter of the transistor 32 has a common connection with one terminal of a resistance 36, the other terminal of which receives a negative potential from a source 38.

The emitter of a transistor 40 is common with the emitter of the transistor 32. The base of the transistor 40 receives on a line 42 an input signal 44 preferably defined by sharp leading and trailing edges. A resistance 46 is connected between the collector of the transistor 40 and the voltage source 20. The output on the collector of the transistor 40 is introduced through a parallel combination of a resistance 48 and a capacitance 50 to the base of the transistor 24. The base of the transistor 24 is also connected to one terminal of a resistance 52, the other terminal of which receives the negative potential from the source 38.

The transistor 32 is normally conductive because of the bias potential on its base. This causes current to flow through a circuit including the voltage source 20, the primary winding 30, the transistor 32, the resistance 36 and the voltage source 38. Since this current is a direct current, no voltage is induced in the winding 30. The flow of current through the resistance 36 produces on the emitter of the transistor 40 a voltage which biases the transistor to a state of non-conductivity. The voltage from the source 20 is accordingly introduced to the base of the transistor 24 to maintain the transistor conductive. This causes the circuit including the capacitance 12 and the transistor 24 to become conductive so that the capacitance remains in a discharged state.

When the leading edge of the input signal 44 is introduced to the base of the transistor 40, the transistor becomes conductive. Current accordingly flows through a circuit including the voltage source 20, the resistance 46, the transistor 40, the resistance 36 and the voltage source 30. The resultant voltage drop across the resistance 46 causes the transistor 24 to become non-conductive. At the same time, the voltage produced across the resistance 36 biases the transistor 32 to a state of non-conductivity.

Because of the interruption of the current through the winding 30, a pulse is induced in the winding. This pulse is indicated at 62 in FIG. 2. The resultant negative pulse in the winding 28 causes the transistor 18 to become non-conductive. This pulse is of such a magnitude that the distributed charge between the base and emitter of the transistor 18 discharges instantaneously through a circuit including the distributed capacitance and the base and emitter of the transistor.

A positive voltage pulse is induced in the winding 26 at the same time that the voltage pulse is induced in the winding 28. This pulse is indicated at 64 in FIG. 2. The voltage pulse in the winding 26 causes the transistor 16 to become conductive. Current accordingly flows through a circuit including the variable voltage source 20a, the transistor 16 and the capacitance 12 to charge the capacitance. This current may have a high amplitude as a result of the saturation of the transistor 16. Because of the saturation of the transistor 16 and the opposition of the winding 26 to the cut-off of current through the winding 30, the voltage on the base of the transistor remains positive for a period of time even after the disappearance of the voltage on the collector of the transistor 18. The voltage pulse on the base of the transistor 16 is indicated at 64 in FIG. 2. In this way, the transistor 16 is maintained conductive even after the production of a pulse 62 on the collector of the transistor by the interruption in the flow of current through the transistor.

The constant current source 22 is included to insure that the capacitance 12 remains fully charged even after the termination of the pulse 64 on the base of the transistor 16. By including the constant current source 22, the voltage across the capacitance 12 is maintained substantially constant even if leakage current flows through the transistors 18 and 24. This is indicated at 68 in FIG. 2. If the constant current source 22 were not included, the voltage across the capacitance 12 would have a waveform such as indicated at 66 in FIG. 2. This would result from the tendency of the capacitance 22 to discharge slowly through the transistor 18 after the termination of the pulse 64 because of leakage current between the collector and the emitter of the transistor 18.

When the trailing edge of the input signal 44 occurs, the transistor 40 becomes non-conductive and the transistor 32 becomes conductive because of the bias on the line 34. The primary winding 30 responds to the change in the circuit including the winding 30 and the transistor 32 by producing a voltage pulse in the winding. The resultant pulse in the winding 28 causes the transistor 18 to become conductive and the resultant pulse in the winding 26 causes the transistor 16 to become non-conductive. The pulses are of relatively high amplitude so that the charge in the distributed capacitance between the base and emitter of the transistor 16 discharges instantaneously through a circuit including the base and emitter of the transistor.

Because of the action of the winding 30 in opposing the flow of current through the transistor 32, a pulse somewhat prolonged in duration is introduced to the base of the transistor 18. This pulse is indicated at 70 in FIG. 2. The prolonged duration of this pulse causes the capacitance 12 to become fully discharged through the transistor 18. The saturating characteristics of the transistor 18 as a result of the high voltage introduced to the base of the transistor also facilitates the full discharge of the capacitance 12 through the transistor.

The discharge of the capacitance 12 is also facilitated by the state of conductivity of the transistor 24, which responds at a relatively low frequency in comparison to the frequency of response of the transistor 18. The conductivity of the transistor 24 results from the current introduced to the base of the transistor from the collector of the transistor 40 when the transistor 40 becomes nonconductive. This voltage at the collector of transistor 40 overcomes the bias introduced to the base of the transistor 24 through the resistance 52 from the voltage source 38 to make the transistor normally non-conductive.

The system described above has certain important advantages. The system provides for the charge and discharge of the capacitance 12 at times within one nanosecond (1 ns.) or less of the occurrence of the leading and trailing edges of the input signal 44. These times are comparable with the reciprocal of the cut-off frequency of the switching elements such as the transistors included in the system. The system provides for the discharge and discharge of the capacitance 12 within such precise time intervals even though the voltage swing across the capacitance may be quite large. This voltage may be limited only by the collector-base breakdown voltages of the transistors included in the system. The system provides these advantages in a simple and reliable manner and with a minimal dissipation of energy. The system may be incorporated on a hybrid incorporating an integrated circuit chip and discrete elements.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination in an electronic switch controlling the charging and discharging of charge storage means having first and second terminals, means for providing a reference voltage,
   means for providing an energizing voltage,
   first switching means connected to the first terminal of the charge storage means and the energizing voltage means and having open and closed states and operative in the open state to prevent the energizing voltage from being introduced to the charge storage means and operative in the closed state to provide for the introduction of the energizing voltage to the charge storage means to charge the charge storage means,
   second switching means connected to the first terminal of the charge storage means and the reference voltage means and having open and closed states and operative in the open state to prevent the discharge of the charge storage means and operative in the closed state to provide for the discharge of the charge storage means through the reference voltage means,
   means for providing an input signal having leading and trailing edges,
   means responsive to the leading edge of the input signal for instantaneously pulsing the first switching means to the closed state and the second switching means to the open state and for maintaining the first switching means in the closed state and the second switching means in the open state for a particular period of time after the leading edge of the input signal,
   means for maintaining a substantially constant flow of current to the charge storage means after the particular period of time in which the first switching means is closed,
   the pulsing means being responsive to the trailing edge of the input signal for instantaneously pulsing the first switching means to the open state and the second switching means to the closed and for maintaining the first switching means in the open state and the second switching means in the closed state for the particular period of time after the trailing edge of the input signal, and
   third switching means having slower response characteristics than the second switching means for maintaining the discharge of the charge storage means to the reference voltage means after the particular period of time in which the second switching means is closed.

2. In a combination as set forth in claim 1,
   the pulsing means including a transformer having a primary winding and two secondary windings,
   the primary winding being responsive to the input signal to produce signals in the secondary windings and the secondary windings being respectively connected to the first and second switching means.

3. In a combination as set forth in claim 1,
   each of the first and second switching means having characteristics of providing a saturating current,
   the pulsing means having characteristics to produce a flow of a saturating current through the first switching means upon a pulsing of the first switching means to the closed state and having characteristics to produce a flow of a saturating current through the second switching means upon a pulsing of the second switching means to the closed state.

4. In a combination as set forth in claim 1,
   the input signal means including fourth and fifth switching means,
   the fourth switching means having open and closed states and being normally operative in the open state and being responsive to the input signal to become operative in the closed state and to remain in the closed state during the occurrence of the input signal,
   the fifth switching means being biased to operate in the closed state and being responsive to the operation of the fourth switching means in the closed state to become operative in the open state,
   the pulsing means being responsive to the operation of the fifth switching means in the open and closed states for pulsing the first and second switching means.

5. In combination in an electrical switch for controlling the charging and discharging of charge storage means,
   means for providing an energizing voltage,
   means for providing a reference voltage,
   a first transistor having conductive and non-conductive states,
   first circuitry including the energizing voltage means, the first transistor and the reference voltage means for providing a charging of the in the conductive state of the first transistor,
   a second transistor having conductive and non-conductive states,
   second circuitry including the second transistor and the reference voltage means for providing a discharge of the charge storage means in the conductive state of the second transistor,
   means for providing an input signal having leading and trailing edges,
   means responsive to the leading edge of the input signal for instantaneously triggering the first transistor to the conductive state and the second transistor to the non-conductive state and responsive to the trailing edge of the input signal for instantaneously triggering the first transistor to the non-conductive state and the second transistor to the conductive state and for maintaining the transistors in their respective states after such triggerings,
   means responsive to the triggering of the first transistor to the conductive state for prolonging the charging of the charge storage means after such triggering, and means responsive to the triggering of the second transistor to the conductive state for prolonging the discharge of the charge storage means after the particular period.

6. In a combination as set forth in claim 5, means responsive to the leading edge of the input signal for producing a pulse for the particular period of time to trigger the first transistor to the conductive state for the particular period of time and responsive to the trailing edge of the input signal for producing a pulse for the particular period of time to trigger the second transistor to the conductive state for the particular period of time.

7. In a combination as set forth in claim 6, the pulse means including a transformer having a first winding connected to the first transistor and having a second winding connected to the second transistor.

8. In a combination as set forth in claim 5, means responsive to the input signal for producing a first voltage during the occurrence of the input signal and for producing a second voltage in the absence of the input signal, and means responsive to the second voltage from the last mentioned means for introducing such voltage to the discharge-prolonging means to obtain the operation of such discharge-prolonging means.

9. In a combination as set forth in claim 8, means having conductive and non-conductive states and means biased to a state of conductivity and responsive to the production of the second voltage to become operative in a state of non-conductivity, and means responsive to the initial operation of the biased means in the conductive state for producing a pulse for the particular period of time to trigger the first transistor to the conductive state for the particular period of time and responsive to the trailing edge of the input signal for producing a pulse for the particular period of time to trigger the second transistor to the conductive state for the particular period of time.

10. In combination in an electronic switch for controlling the charging and discharging of a capacitance, first switching means having open and closed states and connected to the capacitance to produce a charging of the capacitance in the closed state of the first switching means, second switching means having open and closed states and connected to the capacitance to produce a discharge of the capacitance in the closed state of the second switching means, means for providing input signals having leading and trailing edges, means responsive to the leading edges of the input signals for producing first pulses extended for a first limited period of time beyond the leading edges to close the first switching means and open the second switching means during such first limited period of time, means responsive to the trailing edges of the input signals for producing second pulses extended for a second limited period of time beyond the trailing edges to close the second switching means and open the first switching means for such second limited period of time, means operatively coupled to the capacitance for producing an additional charge of the capacitance after the closure of the first switching means for the first limited period of time and until the occurrence of the next trailing edge in the input signals, and means operatively coupled to the capacitance for producing an additional discharge of the capacitance after the closure of the second switching means for the limited period of time and until the occurrence of the leading edge in the next one of the input signals.

11. In a combination as set forth in claim 10, third switching means having open and closed states and biased to the closed state and operative upon the occurrence of the leading edges of the input signals to become operative in the open state and operative upon the occurrence of the trailing edges of the input signals to become operative in the closed state, and means included in a circuit with the third switching means to produce pulses of one polarity for the first limited period of time and to produce pulses of the opposite polarity for the second limited period of time, the means producing the first pulses being operative upon the occurrence of the pulses of the first polarity, and the means producing the second pulses being operative upon the occurrence of the pulses of the second polarity.

12. In a combination as set forth in claim 11, the means producing the pulses of the one polarity and the opposite polarity including a primary winding, the means producing the first pulses including a first secondary winding magnetically coupled to the first winding, and the means producing the second pulses including a second secondary winding magnetically coupled to the first winding.

* * * * *